(12) United States Patent
Lee et al.

(10) Patent No.: US 10,026,900 B2
(45) Date of Patent: Jul. 17, 2018

(54) ULTRAVIOLET LIGHT EMITTING DEVICE

(71) Applicant: INDUSTRY FOUNDATION OF CHONNAM NATIONAL UNIVERSITY, Gwangju (KR)

(72) Inventors: Junekey Lee, Gwangju (KR); Hyokun Son, Yongin-si (KR)

(73) Assignee: INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 0 days.

(21) Appl. No.: 15/343,955

(22) Filed: Nov. 4, 2016

(65) Prior Publication Data

US 2017/0125683 A1    May 4, 2017

(30) Foreign Application Priority Data

Nov. 4, 2015 (KR) .................. 10-2015-0154166

(51) Int. Cl.

| H01J 63/02 | (2006.01) |
|---|---|
| H01L 51/00 | (2006.01) |
| H01L 51/52 | (2006.01) |
| H01L 33/40 | (2010.01) |
| H01L 33/38 | (2010.01) |

(Continued)

(52) U.S. Cl.
CPC .......... *H01L 51/0048* (2013.01); *H01J 63/02* (2013.01); *H01L 33/32* (2013.01); *H01L 33/38* (2013.01); *H01L 33/40* (2013.01); *H01L 51/5271* (2013.01); *H01J 63/06* (2013.01); *H01J 2893/0031* (2013.01); *H01L 33/60* (2013.01)

(58) Field of Classification Search
CPC ... H01L 33/40; H01J 2893/0031; H01J 63/02; H01J 63/06
See application file for complete search history.

(56) References Cited

U.S. PATENT DOCUMENTS 4,791,336 A * 12/1988 Morimoto .......... C09K 11/7702
                                                     252/301.4 H
5,882,779 A *  3/1999 Lawandy .............. B82Y 10/00
                                                     257/102

(Continued)

FOREIGN PATENT DOCUMENTS

| JP | 2006-190541 A | 7/2006 | |
| KR | 10-0697656 | * 3/2007 | ............ H05B 33/26 |

(Continued)

OTHER PUBLICATIONS

Machine translation, Haba, Japanese Pat. Pub. No. JP 2006-190541, translation date: Mar. 29, 2017, Espacenet, all pages.*

*Primary Examiner* — Victoria K Hall
(74) *Attorney, Agent, or Firm* — Womble Bond Dickinson (US) LLP; Joseph Bach, Esq.

(57) ABSTRACT

An ultraviolet light emitting device without the use of a p-type semiconductor layer is described. For generating ultraviolet light, an electron beam generator is provided, and an electron beam generated in the electron beam generator is guided to an active layer of an ultraviolet light generator. In the active layer, the electron beam is collided, and electron-hole pairs generated by the collisions are confined in well layers due to barrier layers of the active layer. The confined electrons and holes generate ultraviolet light through recombination.

6 Claims, 2 Drawing Sheets

(51) Int. Cl.
*H01L 33/32* (2010.01)
*H01L 33/60* (2010.01)
*H01J 63/06* (2006.01)

(56) References Cited

U.S. PATENT DOCUMENTS

| | | | | |
|---|---|---|---|---|
| 6,504,311 | B1* | 1/2003 | Kumar | H01J 63/06 313/309 |
| 7,896,723 | B2* | 3/2011 | Yang | H01J 63/04 427/64 |
| 9,711,255 | B2* | 7/2017 | Kato | C09K 11/55 |
| 9,793,685 | B2* | 10/2017 | Wang | H01L 33/0004 |
| 9,815,699 | B1* | 11/2017 | Zhang | C01B 32/36 |
| 9,845,554 | B2* | 12/2017 | Zhang | D01F 9/12 |
| 9,862,607 | B2* | 1/2018 | Zhang | C01B 32/16 |
| 2001/0044251 | A1* | 11/2001 | Cho | H01J 9/025 445/24 |
| 2005/0179366 | A1* | 8/2005 | Rose | H01J 1/3044 313/503 |
| 2005/0194889 | A1* | 9/2005 | Chen | H01J 31/127 313/495 |
| 2007/0051901 | A1* | 3/2007 | Hopaluk | C02F 1/325 250/436 |
| 2007/0080640 | A1* | 4/2007 | Son | H01J 11/12 313/582 |
| 2007/0132395 | A1* | 6/2007 | Park | H01J 11/12 313/587 |
| 2008/0174229 | A1* | 7/2008 | Jeong | H01J 1/304 313/495 |
| 2008/0191607 | A1* | 8/2008 | Kawai | C09K 11/54 313/503 |
| 2009/0167146 | A1* | 7/2009 | Yang | H01J 61/42 313/495 |
| 2010/0026198 | A1* | 2/2010 | Arai | H01L 21/26506 315/246 |
| 2010/0141115 | A1* | 6/2010 | Kim | C09K 11/574 313/496 |
| 2014/0103289 | A1* | 4/2014 | Liao | H01L 21/0237 257/13 |
| 2014/0291609 | A1* | 10/2014 | Wang | H01L 33/0004 257/10 |
| 2016/0126409 | A1* | 5/2016 | Sannikov | H01L 33/06 345/82 |
| 2017/0327377 | A1* | 11/2017 | Zhang | C01B 32/15 |
| 2017/0345640 | A1* | 11/2017 | Tiren | H01J 63/02 |

FOREIGN PATENT DOCUMENTS

| | | | | |
|---|---|---|---|---|
| KR | 10-0975117 B1 | | 8/2010 | |
| WO | WO 2010/062644 | * | 6/2010 | H01L 21/20 |
| WO | WO 2010/065860 | * | 6/2010 | H05B 33/00 |

* cited by examiner

ULTRAVIOLET LIGHT EMITTING DEVICE

CROSS-REFERENCE TO RELATED APPLICATION

This application claims priority to and the benefit of Korean Patent Application No. 10-2015-0154166, filed on Nov. 4, 2015, the disclosure of which is incorporated herein by reference in its entirety.

TECHNICAL FIELD

The present invention relates to a light emitting device and, more specifically, to a light emitting device that can emit ultraviolet light.

BACKGROUND ART

A light emitting diode is a device that generates and emits light by having electrons excited to a conduction band and holes excited to a valence band recombine. For emitting light, a light emitting diode has a specific multiple quantum well structure. A multiple quantum well structure has multiple thin layers of alternating well and barrier layers. That is, electrons and holes are confined in the well layers formed between the barrier layers, and light is emitted from recombination thereof. This is an effect of quantum confinement.

Accordingly, light generated in a light emitting diode is characteristically determined by bandgap energy of well layers. That is, when bandgap energy of well layers is large, wavelength of light generated therein is short, and when band gap energy of well layers is small, wavelength of light generated therein is long. Electrons confined in well layers are supplied by an n-type semiconductor layer, and holes are supplied by a p-type semiconductor layer. Accordingly, a light generating layer in a multiple quantum well structure form is sandwiched between an n-type semiconductor layer and a p-type semiconductor layer, forming junctions.

Semiconductor layers forming a light emitting diode are made of compound semiconductors. The semiconductor layers require higher bandgap energy than that of well layers in the light generating layer. This is to prevent light generated in the light generating layer from being absorbed in the semiconductor layer. Also, forming a p-type semiconductor layer becomes more and more problematic with decreasing wavelength of generated light. That is, even when a p-type layer containing a dopant is formed via a MOCVD process, etc, with an insufficient concentration of holes, efficiency is lowered. This is especially problematic for a light emitting diode that generates ultraviolet light.

For example, while AlN, AlGaN, or AlGaIn is used as a material for forming a p-type semiconductor layer, dopant activation in a p-type semiconductor layer is not easy, and efficiency is lowered due to low conductivity of the p-type semiconductor layer. Also, light absorption by a semiconductor layer based on p-type GaN is an important reason for decreased efficiency.

However, despite the aforementioned technically difficult problems, market demand for ultraviolet light emitting diodes is steadily increasing. Ultraviolet light emitting diodes have an advantage in terms of environmental friendliness compared to mercury lamps and may be used for elimination of pollutants in a human-living environment through water purification, air purification, disinfection, etc.

However, due to the technically challenging problems of the ultraviolet light emitting diode, efficiency is not sufficiently high, and, consequently, ultraviolet light emitting diodes are not widely applied for the market demand.

DISCLOSURE OF INVENTION

Technical Problem

To solve the aforementioned problems, a technical objective of the present invention is to provide an ultraviolet light emitting device using field effect.

Technical Solution

In order to achieve the objective, the present invention provides an ultraviolet light emitting device including an electron beam generator that generates an electron beam due to an applied voltage and an ultraviolet light generator, that is separated by a space and facing the electron beam generator, for generating ultraviolet light by recombination of electron-hole pairs generated due to collisions of the electron beam.

Advantageous Effects

According to the aforementioned present invention, carbon nanotubes are used for electron emission, and the emitted electrons are incident on an ultraviolet light generator without a p-type semiconductor layer. Incident electrons make collisions in a quantum well structure of an active layer to generate electron-hole pairs. The generated electron-hole pairs are confined in well layers due to barrier layers and generate ultraviolet light by recombination. Accordingly, the problem of low optical efficiency due to formation of a p-type semiconductor and caused by low conductivity is solved.

MODE OF INVENTION

Figure 1:
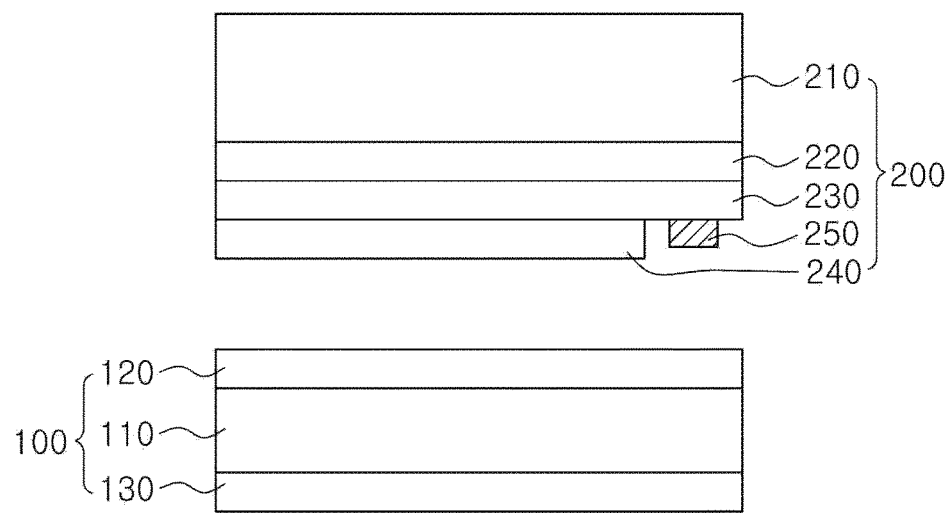
FIG. 1 is a cross sectional view of an ultraviolet light emitting device according a first embodiment of the present invention.

While specific embodiments will be described in drawings and explained here in detail, the present invention can be modified and implemented in various forms. As such, there is no intent to limit the present invention to the specific disclosure, and it should be understood that the present invention includes all modifications, equivalents, and alternatives included in the idea and technical scope thereof. In describing each of the drawings, like reference numerals are used to denote like elements.

Unless otherwise defined, all terms including technical and scientific terms used herein each have the same meaning generally understood by those of ordinary knowledge in the art to which the present invention belongs. General terms, such as terms defined in dictionaries, should each be interpreted by a meaning consistent with the context of related technologies and should not be interpreted by an ideal or excessively formal meaning unless clearly defined so in the present invention.

Hereinafter, exemplary embodiments of the present invention will be described in further detail with reference to accompanying drawings.

Example

FIG. 1 is a cross sectional view of an ultraviolet light emitting device according a first embodiment of the present invention.

Referring to FIG. 1, an ultraviolet emitting device according to the present invention has an electron beam generator 100 and an ultraviolet light generator 200.

An electron beam generator 100 forms an electron beam by field effect and emits electrons toward an ultraviolet light generator 200. An ultraviolet light generator 200 generates electron-hole pairs due to collisions of electrons emitted from the electron beam generator 100 and emits ultraviolet light due to recombination of the generated electron-hole pairs.

The electron beam generator 100 has a cathode 110 and an electron beam emitter 120 formed on the cathode 110. The cathode 110 is provided so that a voltage can be applied to the electron beam emitter 120. For this, the cathode 110 has Al, Ag, Cu, Ti, Pt, Ni, Ir, or Rh.

The electron beam emitter 120 formed on the cathode 110 includes carbon nanotubes. An electron beam is generated due to electric field applied to the carbon nanotubes. It is preferable that at least one carbon nanotube of the electron beam emitter 120 has one end attached to the cathode 110 while the other end does not make contact with the cathode 110. That is, the carbon nanotube stands from and makes a prescribed angle with the surface of the cathode 110. Accordingly, it is preferable that the straight line between the ends of the carbon nanotube is not disposed parallel to the surface of the cathode 110.

Also, a reflective layer 130 may be provided in the back of the cathode 110. The reflective layer 130 is for reflecting ultralight light generated in the ultraviolet light generator 200. For example, the reflective layer 130 may be a distributed Bragg reflector (DBR) layer. The DBR layer may be made with $HfO_2$, $ZrO_2$, $Al_2O_3$, $TiO_2$, $Ti_2O_3$, or $SiO_2$.

The ultraviolet light generator 200 is disposed separated from the electron beam generator 100 by a prescribed distance. The ultraviolet generator 200 has a substrate 210, a buffer layer 220, a semiconductor layer 230, and anode 250.

The substrate 210 is a transparent material such as sapphire, on which growing a buffer layer 220, a semiconductor layer 230, or an active layer 240 is possible, but any material is possible as long as absorption of the generated ultraviolet light can be minimized.

Also, a buffer layer 220 grown on a substrate 210 may be grown using a conventional MOCVD process. The buffer layer 220 is provided to alleviate crystal mismatch due to a lattice mismatch between a substrate 210 and a semiconductor layer 230 and is preferably formed of a material with minimum ultraviolet light absorption. Accordingly, the buffer layer 220 may be formed with AlN or AlGaN material.

A semiconductor layer 230 is formed on the buffer layer 220. The semiconductor layer 230 may have a specific conductivity type. Accordingly, the semiconductor layer 230 may be formed n-type or p-type. In case the semiconductor layer 230 has a specific conductivity type, conductivity may advantageously be achieved, when an electrical connection is made with a cathode 250. Otherwise, the semiconductor layer may be formed as an intrinsic semiconductor. Also, the semiconductor layer 230 is preferably formed with a material with bandgap energy that can minimize absorption of ultraviolet light generated by the active layer 240. Accordingly, the semiconductor layer 230 may include AlN or AlGaN, but any material is applicable as long as the layer has a structure suitable for growing an active layer 240 and is a material that can minimize absorption of generated ultraviolet light.

For example, when the semiconductor layer 230 is formed as an AlGaN layer, the fractional amount of Ga element included in the semiconductor layer 230 is determined by wavelength of the ultraviolet light generated in the active layer 240. For example, for UV-C, which is ultraviolet light in 200 nm to 280 nm range, a semiconductor layer 230 preferably has a smaller fractional amount of Ga compared to that for UV-B, which is ultraviolet light in 280 nm to 315 nm range. Accordingly, for UV-A, which is ultraviolet light in 315 nm to 400 nm range, the fractional amount of Ga may be the highest. This is because bandgap energy decreases with increasing fractional amount of Ga. However, any composition is applicable as long as the semiconductor layer 230 has a bandgap energy suitable for not absorbing ultraviolet light generated in the active layer 240. That is, the semiconductor layer 230 is required to have bandgap energy that is higher than that of well layers of a quantum well structure of an active layer 240.

The active layer 240 is provided on the semiconductor layer 230. The active layer 240 has a structure with alternating barrier and well layers. Well layer composition is adjusted to have bandgap energy suitable for ultraviolet light to be generated. That is, for generating shorter wavelength ultraviolet light, fractional amount of Ga in AlGaN is reduced, and, relative to this, for generating longer wavelength ultraviolet light, fractional amount of Ga is increased. That is, well layers may be formed with AlGaN, and barrier layers may be formed with AlN or AlGaN. Only, it is preferable that bandgap energy of the barrier layer is higher than that of the well layer.

An anode 250 may be formed on the buffer layer 220 or the semiconductor layer 230. For example, by mesa etching the active region 240, an anode 250 made of a metal material may be formed by exposing a portion of the surface of the buffer layer 220 or the semiconductor layer 230.

In addition, the anode and cathode may also be formed in a partial region of the active layer 240 having a quantum well structure.

Also, the electron beam generator 100 and ultraviolet light generator 200 are disposed with a prescribed separation distance, and the space between electron beam generator 100 and ultraviolet light generator is preferably under vacuum.

Figure 2:
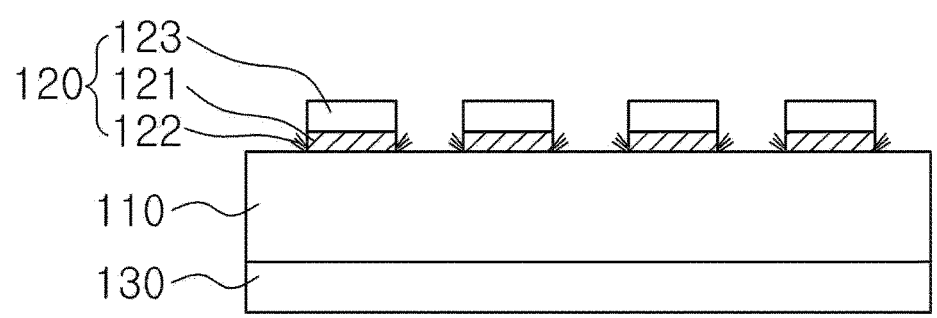
FIG. 2 is a view of the electron beam generator of FIG. 1 according to an exemplary embodiment of the present invention.

FIG. 2 is a view of the electron beam generator of FIG. 1 according to an exemplary embodiment of the present invention.

Referring to FIG. 2, an electron generator 100 includes a cathode 110 and an electron beam emitter 120. Also, in the back of the cathode 110, a reflective layer 130 may be included. The reflective layer 130 may also be formed between the cathode 110 and the electron beam emitter 120.

The cathode 110 is made negative (−) by an externally applied voltage and is preferably made of a conductive metal material.

Also, the electron beam emitter 120 is made of carbon nanotubes. For example, the electron beam emitter 120 has a carbon nanotube layer 121, electron emitting material 122, and patterned metal layer 123.

Carbon nanotube layer 121 is provided on the cathode 110 and may cover the entire or a part of the cathode 110. Also, a patterned metal layer 123 is on the carbon nanotube layer 121, and an electron emitting material 122 that is formed a prescribed angle with the surface of the cathode 110 is provided at the periphery of the patterned metal layer 123. The electron emitting material 122 has single-wall or multiple-wall carbon nanotubes, and a straight line extending in the length direction of the carbon nanotube is not parallel to the surface of the cathode and instead formed with a prescribed angle with respect to the surface thereof.

That is, electron emitting material 122 is made of carbon nanotubes formed to face upward from the corner at which the patterned metal layer 123 and carbon nanotube layer 121 meets.

First, a solution with carbon nanotubes dispersed in a solvent is made to cover the cathode 110. Subsequently, the solvent is evaporated to form a carbon nanotube layer. On the carbon nanotube layer, a patterned metal layer 123 is formed. Accordingly, a patterned metal layer 123 with a prescribed regular arrangement is formed on the carbon nanotube layer 121. Then, the carbon nanotube layer formed between adjacent patterned metal layers 123 is removed. Partially removing carbon nanotube layer may be accomplished using an adhesive such as a tape. That is, a tape is adhered on the carbon nanotube layer and the patterned metal layer 123 and, by delamination, the carbon nanotube layer formed between the patterned metal layer 123 is removed. During the removal, carbon nanotubes disposed at a corner portion of a lower portion of the patterned metal layer 123 are formed to form a prescribed angle with respect to the cathode surface. That is, through the delamination process, carbon nanotubes disposed approximately parallel with the cathode surface are separated therefrom such that one end of a carbon nanotube is separated from the cathode surface to form a prescribed angle with respect to the surface of the cathode surface. Through this, an electron emitting material 122 is formed at a lower corner portion of the patterned metal layer.

Figure 3:
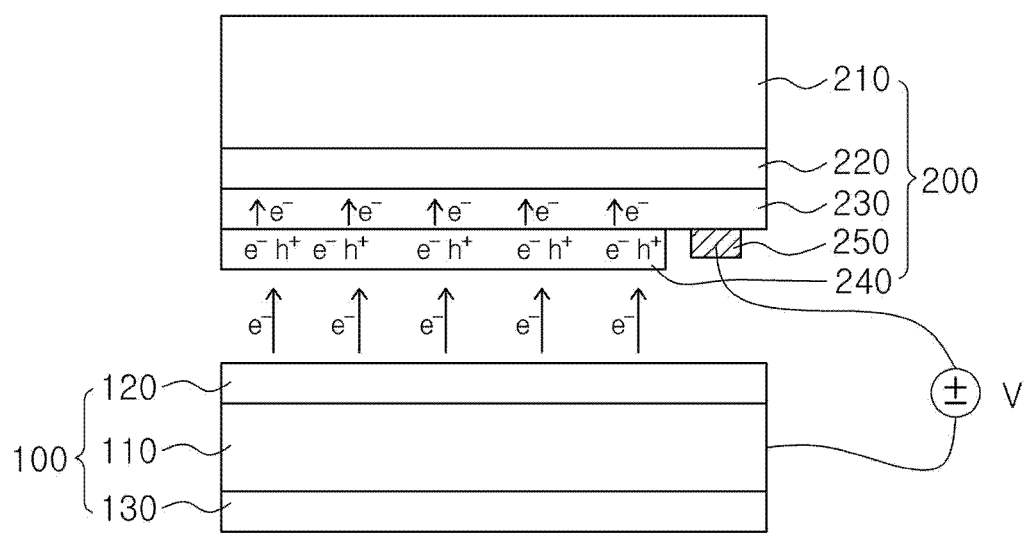
FIG. 3 is a diagram to conceptually describe an operation of an ultraviolet light device according to an exemplary embodiment of the present invention.

FIG. 3 is a diagram to conceptually describe an operation of an ultraviolet light device according to an exemplary embodiment of the present invention.

Referring to FIG. 3, due to externally applied power, a voltage is applied between the electron beam generator 100 and the ultraviolet light generator 200. That is, a voltage is applied between the cathode 110 and the anode 250 of the electron beam generator 100. Due to the applied voltage, the electron beam emitter 120 on the cathode layer 110 forms an electron beam that is incident on the ultraviolet light generator 200 through the separating space between the electron beam generator 100 and the ultraviolet light generator 200.

An electron beam incident on the ultraviolet light generator 200 makes collisions in the active layer 240 having a quantum well structure. Electron-hole pairs are formed in the active layer 240 due to the collisions in the active layer 240. Electrons of the electron-hole pairs formed are excited to the conduction band of the well layers, and holes are excited to the valence band of the well layers. The electrons excited to the conduction band and holes excited to the valence band are confined by the barrier layers. Also, the electrons and holes confined in the well layers due to the barrier layers recombine, and light generation occurs.

Also, excess electrons and holes that do not participate in recombination move to the semiconductor layer 230.

In the aforementioned, present invention, cathodoluminescence (CL) is used to generate ultraviolet light. In a conventional ultraviolet light emitting diode structure with a multiple quantum well structure sandwiched between a p-type semiconductor layer and a n-type semiconductor layer, due to the technical limitations of the p-type semiconductor layer, optical efficiency is very low, at approximately 2%. This is due to the dopant not adequately acting as acceptors and, thus, due to low conductivity of the p-type semiconductor layer.

In the present invention, no p-type semiconductor layer is used, and electron-hole pairs are directly formed in an active layer due to an electron beam. Accordingly, production of electron-hole pairs may be determined by the applied electron beam density and energy, and through this, an ultraviolet light emitting device with high brightness and efficiency may be realized.

The invention claimed is:

1. An ultraviolet light emitting device, comprising:
   an electron beam generator that generates an electron beam due to an applied voltage; and
   an ultraviolet light generator facing the electron beam generator with a separation space under vacuum,
   wherein the ultraviolet light generator comprises,
   a substrate,
   a n-type semiconductor layer formed on the substrate,
   an active layer having quantum well structure and formed on the n-type semiconductor layer, and generating ultraviolet light resulting from recombination of electron-hole pairs, and
   an anode formed on the n-type semiconductor layer for applying a voltage to the active layer,
   wherein the electron-hole pairs are generated by collision of the electron beam with the active layer,
   wherein the electron beam directly contacts the active layer.

2. The ultraviolet light emitting device of claim 1, wherein the electron beam generator comprises:
   a cathode to which a voltage is applied; and
   an electron beam emitter formed on the cathode and for generating an electron beam using carbon nanotubes.

3. The ultraviolet light emitting device of claim 2, wherein the electron beam emitter comprises:
   a carbon nanotube layer formed on the cathode;
   a patterned metal layer having mutually separating spaces and formed on the carbon nanotube layer and;
   an electron emitting material, made of carbon nanotubes having an end portion separated from the cathode surface to emit the electron beam.

4. The ultraviolet light emitting device of claim 2, wherein the electron beam generator further comprises a reflection layer disposed on the cathode and facing the electron beam emitter, with the cathode in the middle, to reflect the ultraviolet light.

5. The ultraviolet light emitting device of claim 1, wherein the n-type semiconductor layer includes AlN or AlGaN.

6. The ultraviolet light emitting device of claim 1, wherein the generated electron-hole pairs are confined in well layers due to barrier layers of the active layer and generate ultraviolet light by recombination.

* * * * *